United States Patent [19]
Yamamoto et al.

[11] Patent Number: 5,474,488
[45] Date of Patent: Dec. 12, 1995

[54] METHOD OF FORMING ELECTRODES ON A DIELECTRIC RESONATOR PART

[75] Inventors: Yoshio Yamamoto; Kei Arai; Nobuyuki Hayashi, all of Kanazawa; Masaru Kojima, Echi, all of Japan

[73] Assignee: Murata Manufacturing Co., Ltd., Kyoto, Japan

[21] Appl. No.: 184,080

[22] Filed: Jan. 18, 1994

[30] Foreign Application Priority Data

May 25, 1993 [JP] Japan .................................. 5-146991

[51] Int. Cl.⁶ ..................................................... B24B 1/04
[52] U.S. Cl. ................................ 451/28; 451/36; 451/165
[58] Field of Search ............................... 451/28, 36, 162, 451/163, 164, 165, DIG. 10

[56] References Cited

U.S. PATENT DOCUMENTS

| | | | |
|---|---|---|---|
| 3,561,462 | 2/1971 | Jugler | 451/165 |
| 4,100,701 | 7/1978 | Bessaguet | 451/165 |
| 4,122,603 | 10/1978 | Sastri | 451/165 |
| 4,934,103 | 6/1990 | Campergue et al. | 451/165 |

FOREIGN PATENT DOCUMENTS 1576283  7/1990  U.S.S.R. ................................ 451/165

*Primary Examiner*—Maurina T. Rachuba
*Attorney, Agent, or Firm*—Majestic, Parsons, Siebert & Hsue

[57] ABSTRACT

An apparatus for forming input and output electrodes on the outer peripheral surface of a dielectric block coated with an electrically conductive film includes a holder for holding the block, a cutting tool with cutting surfaces, and a compression pump. Mobile tables supporting the holder and the cutting tool are controlled to cause the cutting surfaces to come in contact with a specified area on the outer peripheral surface of the block. Cutting water mixed with abrasive grains is projected by the compression pump onto the specified area, and ultrasonic vibrations generated by a vibration generator and amplified by an amplifier horn are transmitted to the cutter, causing a portion of the conductive film to be removed from a frame-shaped area, leaving an isolated piece of the conductive film separated from the remainder of the film to serve as an electrode.

10 Claims, 3 Drawing Sheets

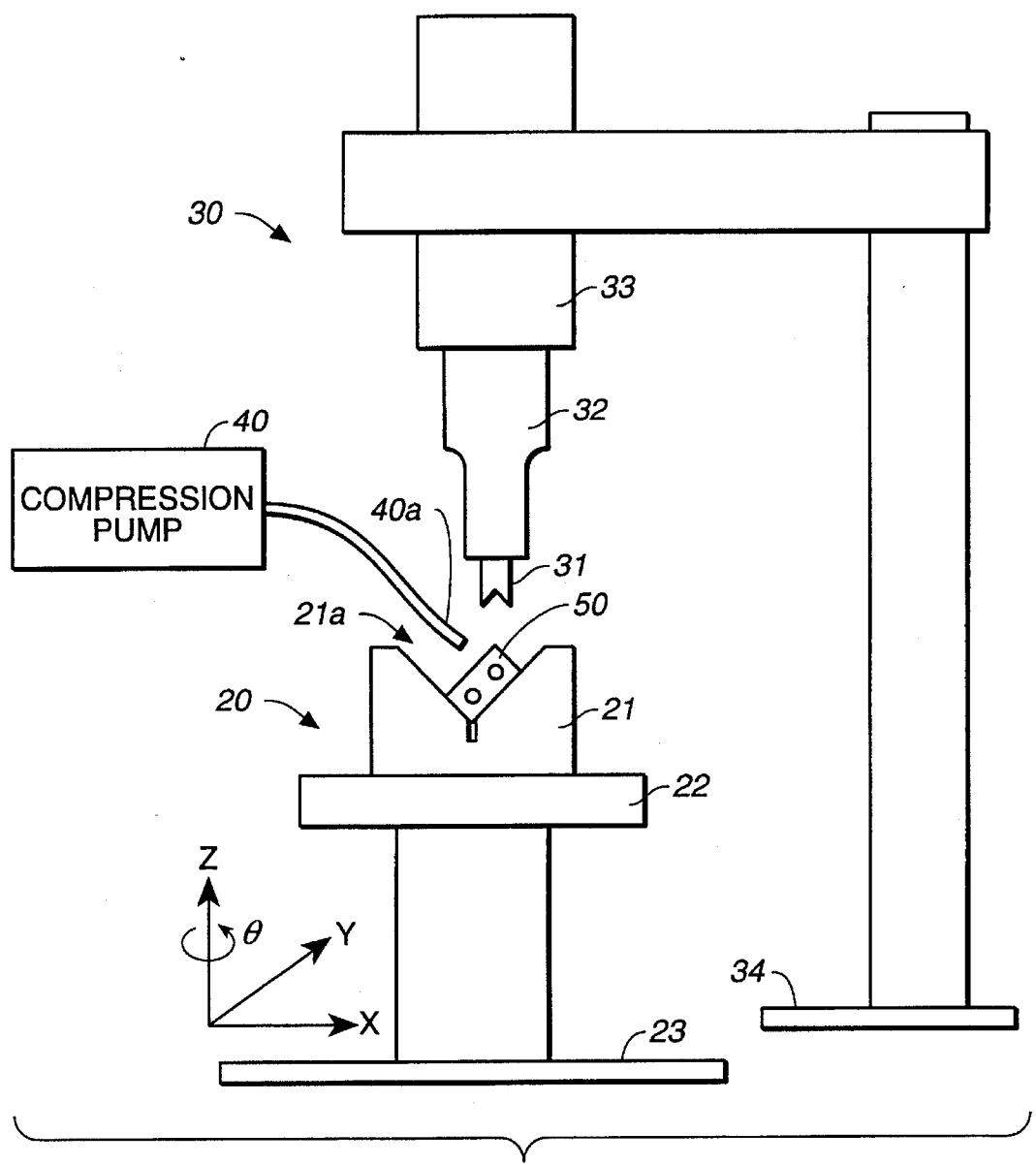
FIG._1

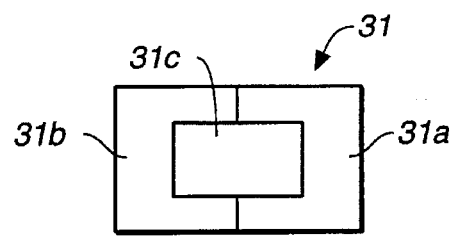
FIG._2
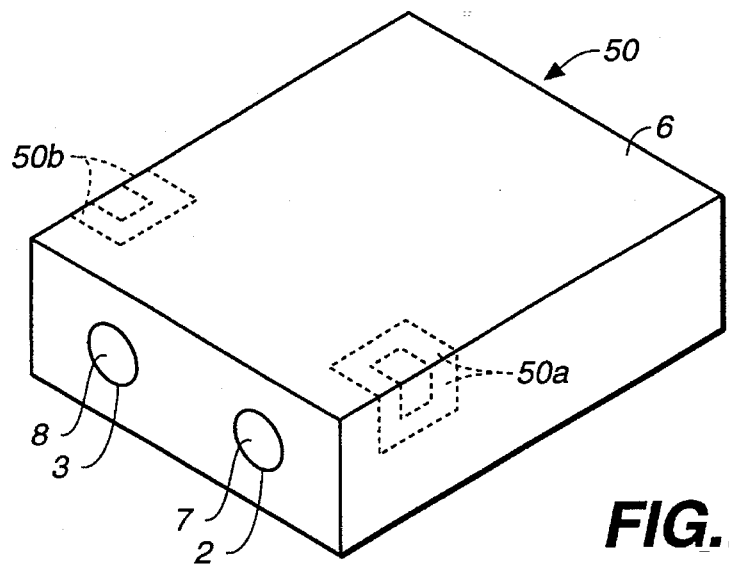
FIG._3
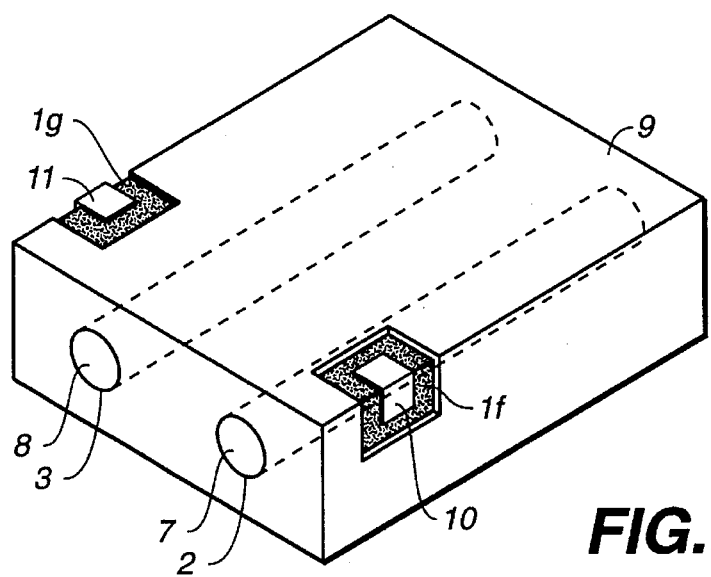
FIG._4

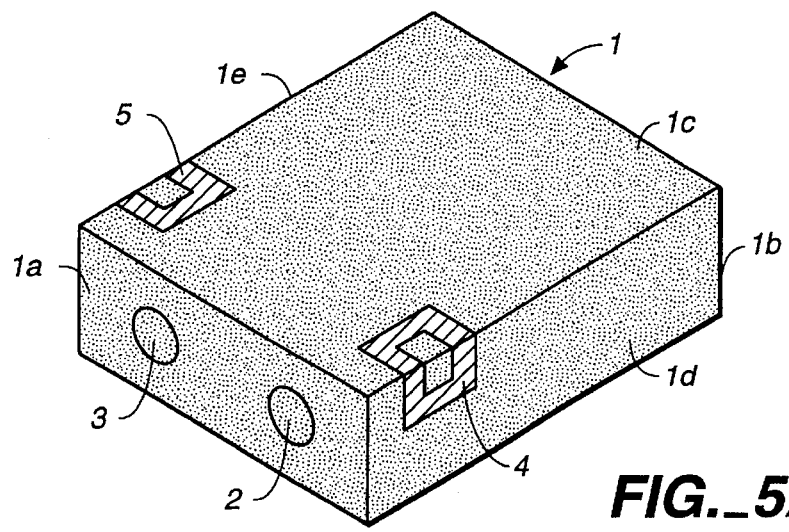
FIG._5A
(PRIOR ART)
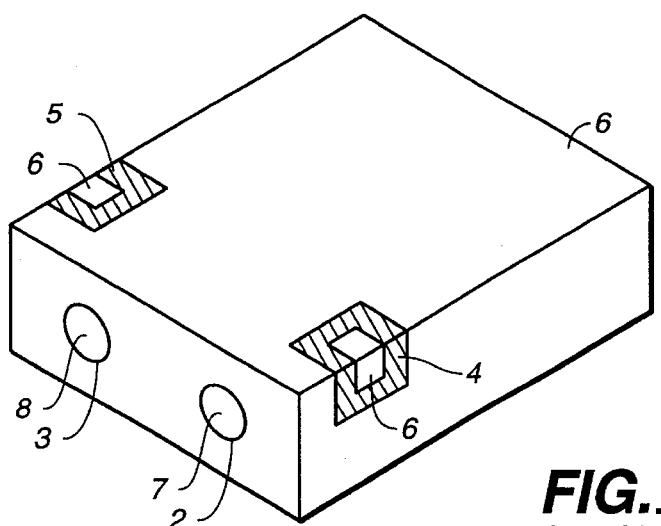
FIG._5B
(PRIOR ART)
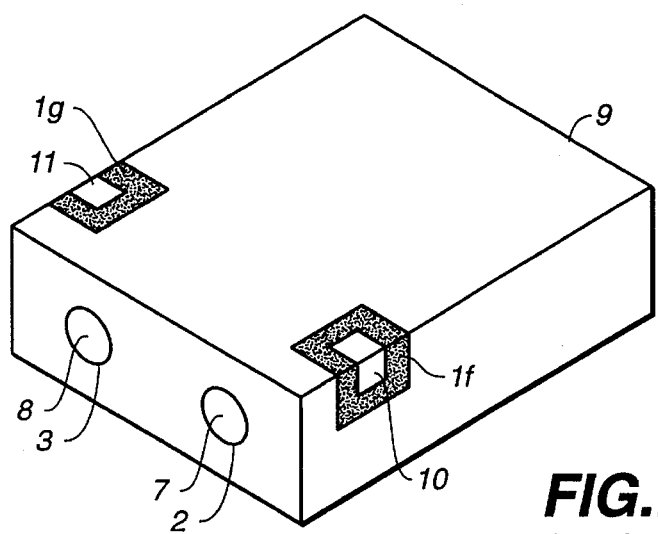
FIG._5C
(PRIOR ART)

METHOD OF FORMING ELECTRODES ON A DIELECTRIC RESONATOR PART

BACKGROUND OF THE INVENTION

This invention relates to a method of forming electrodes on a dielectric resonator part, and more particularly to a method of forming input and output electrodes on the outer peripheral surface of a dielectric block during the production process of a dielectric resonator part comprising a dielectric block having at least one dielectric coaxial resonator.

FIGS. 5(a), 5(b) and 5(c) show a prior art process for forming input and output electrodes on a dielectric resonator part. First, a dielectric block 1 is prepared which is approximately a rectangular parallelopiped in shape. As shown in FIG. 5(a), two throughholes 2 and 3 are formed through the block 1 connecting its front surface 1a with its back surface 1b, and a pair of resist films 4 and 5, each configured in the shape of a frame, is formed on the outer peripheral surface of the block 1 by a screen printing or padding method, one of them (indicated by numeral 4) extending over the upper surface 1c of the block 1 and its right-hand side surface 1d and the other of them (indicated by numeral 5) extending over the upper surface 1c and the left-hand side surface 1e. Next, as shown in FIG. 5(b), an electrically conductive film 6 is formed all over the external surface of the dielectric block 1 and the entire inner surfaces of the throughholes 2 and 3 are coated with an electrically conductive material (referred to as inner conductors 7 and 8, respectively). Next, as shown in FIG. 5(c), the resist films 4 and 5 are removed from the dielectric block 1. Accordingly, frame-shaped areas 1f and 1g on the outer periphery of the block 1, which were under the resist films 4 and 5, become exposed to the exterior, and the conductive film 6 covering the external surface of the block 1 becomes divided into three mutually separated parts, that is, an input electrode 10, an output electrode 11 and the remainder which will be referred to as the outer conductor 9.

Thereafter, annular portions of the inner conductors 7 and 8 with a specified width are removed inside the throughholes 2 and 3 such that each of the inner conductors 7 and 8 is electrically insulated from the part of the outer conductor 9 on the front surface 1a but remains electrically connected to the part of the outer conductor 9 on the back surface 1b of the block 1. The input and output electrodes 10 and 11 are coupled capacitively with the inner conductors 7 and 8, respectively. Two dielectric coaxial resonators of one-open-end-and-one-short-circuited-end type are thus formed in the dielectric block 1. Such a prior art method of forming electrodes, as described above, is very troublesome to carry out because it includes a resist-forming process for forming the resist films 4 and 5 and a resist-removing process for removing them. The resist-forming process is particularly troublesome because two resist films 4 and 5 must be formed separately on the edge between the top surface 1c and the right-hand side surface 1d and the opposite edge between the top surface 1c and the left-hand side surface 1e. Productivity by such a prior art method, therefore, was very low.

In addition, the prior art method as described above makes it necessary to complete the patterning of the resist films 4 and 5 before the conductive film 6 and the inner conductors 7 and 8 are formed. Thus, the patterns and the positions of the input and output electrodes cannot be changed easily.

SUMMARY OF THE INVENTION

It is therefore an object of the invention to provide a method of forming electrodes on a dielectric resonator part by which high productivity can be achieved and the patterns and positions of the electrodes can be changed easily.

According to the present invention, by which the above and other objects can be accomplished, a dielectric block with its outer peripheral surfaces coated with a conductive film is placed on a holding jig, and specified frame-shaped areas of the conductive film are removed by ultrasonic vibrations. For this purpose, an ultrasonic vibration generator is provided and its vibrations are amplified and transmitted to a tool. The relative position and orientation of the dielectric block and the tool can be changed such that cutting surfaces of the tool can be brought into contact with a desired target area on the conductive film coating the outer surface of the dielectric block. As the desired portions of the conductive film are removed in the shape of a frame, the island-like portions of the conductive film are left separated from the remainder and serve as input and output electrodes.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings:

FIG. 1 is a schematic side view of an apparatus for using a method embodying the present invention;

FIG. 2 is a bottom view of the tip of the tool shown in FIG. 1;

FIG. 3 is a perspective diagonal view of a work piece before it is processed by the apparatus of FIG. 1;

FIG. 4 is a perspective diagonal view of a dielectric resonator part after input and output electrodes have been formed; and FIGS. 5(a), 5(b) and 5(c) are perspective diagonal views of a work piece for showing a prior art method of forming electrodes on a dielectric resonator part.

In these figures, corresponding or substantially equivalent components and parts are indicated by the same numerals.

DETAILED DESCRIPTION OF THE INVENTION

As shown in FIG. 1, an apparatus for using a method embodying the invention for forming input and output electrodes is comprised of a stage structure 20, an ultrasonic cutting device 30 and a compression pump 40. The stage structure 20 includes a holder jig 21, a work bench 22 and a mobile table 23. An indentation 21a is formed on the top surface of the holder jig 21 such that a work piece 50 rests in this indentation 21a at an angle of about 45°. The holder jig 21 is affixed to the work bench 22, and the work bench 22 is supported by the mobile table 23 so as to be itself movable. The mobile table 23 has three mutually orthogonal axes (X-axis, Y-axis and Z-axis) and an axis of rotation (θ-axis) around the Z-axis and actuators for moving itself, and hence also the work piece 50 held thereby, in the direction of each of these axes. These actuators may be each comprised of a pulse motor, a servo motor or a hydraulic control device.

The ultrasonic cutting device 30 includes a tool 31, an amplifier horn 32, an ultrasonic vibration generator 33 and a mobile table 34. The ultrasonic vibration generator 33 is adapted to generate ultrasonic waves of frequency about 16–26 KHz. The ultrasonic wave generated by this vibration generator 33 is amplified by the amplifier horn 32 and thereafter transmitted to the tool 31. The ultrasonic vibration generator 33 is supported movably on the mobile table 34 which, like the other mobile table 23 described above, has three mutually orthogonal axes (X-axis, Y-axis and Z-axis) and an axis of rotation (θ-axis) around the Z-axis. It also has actuators for moving itself, and hence also the tool 31 bound to move therewith, in the direction of each of these axes. These actuators may also be each comprised of a pulse motor, a servo motor or a hydraulic control device.

The compression pump 40 serves to compress water mixed with abrasive grains (mainly of boron carbide) and to project it as cutting water through nozzles 40a. The cutting water projected through the nozzles 40a is directed to the space between the work piece 50 and the tool 31.

As shown in FIG. 2, the tip of the tool 31 includes a combination of two cutting surfaces 31a and 31b which are approximately perpendicular to each other, and there is a hollow area 31c at the center of the tool 31 for leaving an island-like area to serve as an electrode on the work piece 50, as will be explained below more in detail.

Next, a method of using the apparatus shown in FIGS. 1 and 2 will be explained. First, the work piece 50 is prepared and placed on the holder jig 21. The work piece 50 includes a dielectric block in the shape of a rectangular parallelopiped, as shown in FIG. 3, and the outer peripheral surfaces of the dielectric block are entirely covered with the conductive film 6. The dielectric block has two throughholes 2 and 3 formed therethrough, and the inner surfaces of these throughholes 2 and 3 are coated with inner conductors 7 and 8, as explained above with reference to FIGS. 5(a), 5(b) and 5(c). Next, the mobile tables 23 and 34 are operated in order to correctly position the tool 31 with respect to the work piece 50. The cutting surfaces 31a and 31b at the tip of the tool 31 are positioned first so as to come into contact with a first frame-shaped area 50a shown by dotted lines in FIG. 3.

Next, the compression pump 40 is activated, and the cutting water is projected through the nozzles 40a and sprays the work piece 50. The ultrasonic vibration generator 33 is activated thereafter to generate ultrasonic vibrations. These vibrations are amplified by the amplifier horn 32 and transmitted to the tool 31. As a result, the abrasive grains between the cutting surfaces 31a and 31b and the work piece 50 vibrate, and the portion of the conductive film 6 in contact with the cutting surfaces 31a and 31b is removed, thereby forming a frame-shaped groove on the surface of the work piece 50, leaving inside an island completely surrounded by the groove. The depth of the groove thus formed can be ascertained by using a strain sensor or the like (not shown) to detect the condition of contact between the tool 31 and the work piece 50. When the detected depth of the groove reaches a predetermined level, or when a predetermined process time has elapsed, either the ultrasonic vibration generator 33 is lifted or the work bench 22 is lowered to stop the processing of the work piece 50.

Next, the work piece 50 is lifted from the holder jig 21, rotated by 180° and placed on the holder jig 21 again The mobile tables 23 and 34 are operated to position the tool 31 with respect to the work piece 50. This time, the tool 31 is positioned such that its cutting surfaces 31a and 31b will come into contact with a second frame-like area 50b indicated by dotted lines in FIG. 3. Thereafter, the portion of the conductive film 6 in the second area 50b is removed similarly as explained above, leaving inside an island-like area entirely surrounded by the groove.

FIG. 4 shows a dielectric resonator part thus obtained, having grooves formed on frame-shaped areas 1f and 1g corresponding to the first and second areas 50a and 50b shown in FIG. 3 such that the surface of the dielectric block is exposed to the exterior through these grooves. Since the grooves are frame-shaped, each enclosing an island-like area, the conductive film 6 is now divided into three mutually separated parts, that is, the inner and outer electrodes 10 and 11 and the remainder, which will again be referred to as the outer conductor 9. In summary, the input and output electrodes 10 and 11 are formed on the surface of the dielectric block by using the ultrasonic vibration generator 33 to remove parts of the conductive film 6 from the surface of the work piece 50.

It is to be noted that the level of capacitive coupling between the input and output electrodes 10 and 11 and the inner conductors 7 and 8 is determined by the depth of the aforementioned grooves, that is, the deeper the grooves, the stronger the capacitive coupling. In other words, the external quality factor (or "Q", as commonly known) becomes smaller as the grooves are made deeper.

The present invention was described above with reference to only one illustrated example, but this example is not intended to limit the scope of the invention. Many modifications and variations are possible within the scope of the invention. For example, the dielectric block may have only one dielectric coaxial resonator formed therein. The shape of the cutting surfaces at the tip of the tool need not be exactly as described above, depending upon the shape of the electrode to be formed on the dielectric block. Throughout herein, the expressions "frame-shaped" and "frame-like" related to an area, or a portion, are intended to be interpreted broadly, indicating any configuration topologically equivalent to a ring such that an area completely enclosed thereby (described above also by expression like "an island") can be clearly identifiable.

In summary, the present invention discloses an apparatus for and a method of forming electrodes on a dielectric resonator part by using ultrasonic vibrations to remove portions of a conductive film formed on the outer surface of a dielectric block, thereby separating the conductive film into electrodes and the remainder. Thus, the process for the electrode formation is simplified, and since the patterns and/or the positions of the electrodes can be freely changed, the invention provides a production process with a high degree of freedom.

What is claimed is:

1. A method of forming electrodes on an outer peripheral surface of a dielectric block coated with an electrically conductive film for producing a dielectric resonator part, said method comprising the steps of:

supporting said dielectric block on a holder;

positioning a cutting tool having cutting surfaces with respect to said dielectric block such that said cutting surfaces contact a specified frame-shaped area on said outer peripheral surface of said dielectric block, said frame-shaped area completely surrounding an isolated area on said outer peripheral surface;

transmitting ultrasonic vibrations to said cutting tool; and thereby removing said conductive film from said specified area such that an isolated piece of said conductive film remains on said isolated area.

2. The method of claim 1 further comprising the step of projecting cutting water containing abrasive grains to spray said dielectric block therewith.

3. The method of claim 2 wherein said abrasive grains comprise boron carbide.

4. The method of claim 1 further comprising the step of causing said cutting tool to form a groove on said peripheral surface of said dielectric block around said isolated area.

5. The method of claim 4 further comprising the step of detecting the depth of said groove in order to stop said step of causing said cutting tool to form said groove.

6. The method of claim 1 wherein said ultrasonic vibrations have frequency of 16–26 KHz.

7. The method of claim 1 wherein said positioning step comprises moving either or both of said cutting tool and said holder.

8. The method of claim 1 wherein said dielectric block is substantially a rectangular parallelopiped and said cutting tool has two cutting surfaces which are substantially perpendicular to each other.

9. The method of claim 8 wherein both said specified frame-shaped area and said isolated piece of said conductive film extend over two mutually adjacent surfaces of said parallelopiped of said dielectric block.

10. The method of claim 1 wherein both said specified frame-shaped area and said isolated piece of said conductive film extend over two surfaces which are not mutually coplanar.

\* \* \* \* \*